(12) United States Patent
Xiao et al.

(10) Patent No.: US 9,065,043 B1
(45) Date of Patent: Jun. 23, 2015

(54) TUNNEL MAGNETORESISTANCE READ HEAD WITH NARROW SHIELD-TO-SHIELD SPACING

(71) Applicant: Western Digital (Fremont), LLC, Fremont, CA (US)

(72) Inventors: Rongfu Xiao, Dublin, CA (US); Guanxiong Li, Fremont, CA (US); Zhihong Zhang, Fremont, CA (US); Ming Mao, Dublin, CA (US); Chen-Jung Chien, Mountain View, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 14/242,717

(22) Filed: Apr. 1, 2014

Related U.S. Application Data

(62) Division of application No. 13/538,650, filed on Jun. 29, 2012, now Pat. No. 8,711,528.

(51) Int. Cl.
   *G11B 5/39*  (2006.01)
   *H01L 43/12*  (2006.01)
   *G11B 5/31*  (2006.01)
   *G11B 5/33*  (2006.01)

(52) U.S. Cl.
   CPC .............. *H01L 43/12* (2013.01); *G11B 5/3163* (2013.01); *Y10T 29/49052* (2015.01)

(58) Field of Classification Search
   CPC ..................... G11B 2005/3996; G11B 5/3163; G11B 5/3909; G11B 5/398; G11B 5/313; Y10T 29/49044; Y10T 29/49046; Y10T 29/49052; Y10T 29/49043; Y10T 29/49032; Y10T 29/49048; Y10T 29/49041; Y10T 29/49034; H01L 43/14
   USPC ............. 29/603.13–603.15, 603.18; 360/319, 360/324–324.2
   See application file for complete search history.

(56) References Cited

U.S. PATENT DOCUMENTS

| | | | |
|---|---|---|---|
| 5,612,098 | A | 3/1997 | Tan et al. |
| 5,717,550 | A | 2/1998 | Nepela et al. |
| 5,828,530 | A | 10/1998 | Gill et al. |
| 5,876,848 | A | 3/1999 | Tan et al. |
| 5,898,547 | A | 4/1999 | Fontana, Jr. et al. |
| 6,016,290 | A | 1/2000 | Chen et al. |
| 6,018,441 | A | 1/2000 | Wu et al. |
| 6,025,978 | A | 2/2000 | Hoshi et al. |
| 6,025,988 | A | 2/2000 | Yan |
| 6,032,353 | A | 3/2000 | Hiner et al. |
| 6,033,532 | A | 3/2000 | Minami |
| 6,034,851 | A | 3/2000 | Zarouri et al. |
| 6,043,959 | A | 3/2000 | Crue et al. |
| 6,046,885 | A | 4/2000 | Aimonetti et al. |
| 6,049,650 | A | 4/2000 | Jerman et al. |
| 6,055,138 | A | 4/2000 | Shi |
| 6,058,094 | A | 5/2000 | Davis et al. |
| 6,073,338 | A | 6/2000 | Liu et al. |
| 6,078,479 | A | 6/2000 | Nepela et al. |

(Continued)

OTHER PUBLICATIONS

Joe Blow, et al., U.S. Appl. No. 12/731,108, filed Mar. 24, 2010, 25 pages.

*Primary Examiner* — Will J Klimowicz

(57) ABSTRACT

A tunnel magnetoresistance (TMR) read sensor having a tabbed AFM layer and an extended pinned layer and methods for making the same are provided. The TMR read sensor has an AFM layer recessed from the air bearing surface, providing a reduced shield-to-shield distance.

6 Claims, 11 Drawing Sheets

(56) References Cited

U.S. PATENT DOCUMENTS

| | | |
|---|---|---|
| 6,081,499 A | 6/2000 | Berger et al. |
| 6,094,803 A | 8/2000 | Carlson et al. |
| 6,099,362 A | 8/2000 | Viches et al. |
| 6,103,073 A | 8/2000 | Thayamballi |
| 6,108,166 A | 8/2000 | Lederman |
| 6,118,629 A | 9/2000 | Huai et al. |
| 6,118,638 A | 9/2000 | Knapp et al. |
| 6,125,018 A | 9/2000 | Takagishi et al. |
| 6,130,779 A | 10/2000 | Carlson et al. |
| 6,134,089 A | 10/2000 | Barr et al. |
| 6,136,166 A | 10/2000 | Shen et al. |
| 6,137,661 A | 10/2000 | Shi et al. |
| 6,137,662 A | 10/2000 | Huai et al. |
| 6,160,684 A | 12/2000 | Heist et al. |
| 6,163,426 A | 12/2000 | Nepela et al. |
| 6,166,891 A | 12/2000 | Lederman et al. |
| 6,173,486 B1 | 1/2001 | Hsiao et al. |
| 6,175,476 B1 | 1/2001 | Huai et al. |
| 6,178,066 B1 | 1/2001 | Barr |
| 6,178,070 B1 | 1/2001 | Hong et al. |
| 6,178,150 B1 | 1/2001 | Davis |
| 6,181,485 B1 | 1/2001 | He |
| 6,181,525 B1 | 1/2001 | Carlson |
| 6,185,051 B1 | 2/2001 | Chen et al. |
| 6,185,077 B1 | 2/2001 | Tong et al. |
| 6,185,081 B1 | 2/2001 | Simion et al. |
| 6,188,549 B1 | 2/2001 | Wiitala |
| 6,190,764 B1 | 2/2001 | Shi et al. |
| 6,193,584 B1 | 2/2001 | Rudy et al. |
| 6,195,229 B1 | 2/2001 | Shen et al. |
| 6,198,608 B1 | 3/2001 | Hong et al. |
| 6,198,609 B1 | 3/2001 | Barr et al. |
| 6,201,673 B1 | 3/2001 | Rottmayer et al. |
| 6,204,998 B1 | 3/2001 | Katz |
| 6,204,999 B1 | 3/2001 | Crue et al. |
| 6,212,153 B1 | 4/2001 | Chen et al. |
| 6,215,625 B1 | 4/2001 | Carlson |
| 6,219,205 B1 | 4/2001 | Yuan et al. |
| 6,221,218 B1 | 4/2001 | Shi et al. |
| 6,222,707 B1 | 4/2001 | Huai et al. |
| 6,229,782 B1 | 5/2001 | Wang et al. |
| 6,230,959 B1 | 5/2001 | Heist et al. |
| 6,233,116 B1 | 5/2001 | Chen et al. |
| 6,233,125 B1 | 5/2001 | Knapp et al. |
| 6,237,215 B1 | 5/2001 | Hunsaker et al. |
| 6,252,743 B1 | 6/2001 | Bozorgi |
| 6,255,721 B1 | 7/2001 | Roberts |
| 6,258,468 B1 | 7/2001 | Mahvan et al. |
| 6,266,216 B1 | 7/2001 | Hikami et al. |
| 6,271,604 B1 | 8/2001 | Frank, Jr. et al. |
| 6,275,354 B1 | 8/2001 | Huai et al. |
| 6,277,505 B1 | 8/2001 | Shi et al. |
| 6,282,056 B1 | 8/2001 | Feng et al. |
| 6,296,955 B1 | 10/2001 | Hossain et al. |
| 6,297,955 B1 | 10/2001 | Frank, Jr. et al. |
| 6,304,414 B1 | 10/2001 | Crue, Jr. et al. |
| 6,307,715 B1 | 10/2001 | Berding et al. |
| 6,310,746 B1 | 10/2001 | Hawwa et al. |
| 6,310,750 B1 | 10/2001 | Hawwa et al. |
| 6,317,290 B1 | 11/2001 | Wang et al. |
| 6,317,297 B1 | 11/2001 | Tong et al. |
| 6,322,911 B1 | 11/2001 | Fukagawa et al. |
| 6,330,136 B1 | 12/2001 | Wang et al. |
| 6,330,137 B1 | 12/2001 | Knapp et al. |
| 6,333,830 B2 | 12/2001 | Rose et al. |
| 6,340,533 B1 | 1/2002 | Ueno et al. |
| 6,349,014 B1 | 2/2002 | Crue, Jr. et al. |
| 6,351,355 B1 | 2/2002 | Min et al. |
| 6,353,318 B1 | 3/2002 | Sin et al. |
| 6,353,511 B1 | 3/2002 | Shi et al. |
| 6,356,412 B1 | 3/2002 | Levi et al. |
| 6,359,779 B1 | 3/2002 | Frank, Jr. et al. |
| 6,369,983 B1 | 4/2002 | Hong |
| 6,376,964 B1 | 4/2002 | Young et al. |
| 6,377,535 B1 | 4/2002 | Chen et al. |
| 6,381,095 B1 | 4/2002 | Sin et al. |
| 6,381,105 B1 | 4/2002 | Huai et al. |
| 6,389,499 B1 | 5/2002 | Frank, Jr. et al. |
| 6,392,850 B1 | 5/2002 | Tong et al. |
| 6,396,660 B1 | 5/2002 | Jensen et al. |
| 6,399,179 B1 | 6/2002 | Hanrahan et al. |
| 6,400,526 B2 | 6/2002 | Crue, Jr. et al. |
| 6,404,600 B1 | 6/2002 | Hawwa et al. |
| 6,404,601 B1 | 6/2002 | Rottmayer et al. |
| 6,404,706 B1 | 6/2002 | Stovall et al. |
| 6,410,170 B1 | 6/2002 | Chen et al. |
| 6,411,522 B1 | 6/2002 | Frank, Jr. et al. |
| 6,417,998 B1 | 7/2002 | Crue, Jr. et al. |
| 6,417,999 B1 | 7/2002 | Knapp et al. |
| 6,418,000 B1 | 7/2002 | Gibbons et al. |
| 6,418,048 B1 | 7/2002 | Sin et al. |
| 6,421,211 B1 | 7/2002 | Hawwa et al. |
| 6,421,212 B1 | 7/2002 | Gibbons et al. |
| 6,424,505 B1 | 7/2002 | Lam et al. |
| 6,424,507 B1 | 7/2002 | Lederman et al. |
| 6,430,009 B1 | 8/2002 | Komaki et al. |
| 6,430,806 B1 | 8/2002 | Chen et al. |
| 6,433,965 B1 | 8/2002 | Gopinathan et al. |
| 6,433,968 B1 | 8/2002 | Shi et al. |
| 6,433,970 B1 | 8/2002 | Knapp et al. |
| 6,437,945 B1 | 8/2002 | Hawwa et al. |
| 6,445,536 B1 | 9/2002 | Rudy et al. |
| 6,445,542 B1 | 9/2002 | Levi et al. |
| 6,445,553 B2 | 9/2002 | Barr et al. |
| 6,445,554 B1 | 9/2002 | Dong et al. |
| 6,447,935 B1 | 9/2002 | Zhang et al. |
| 6,448,765 B1 | 9/2002 | Chen et al. |
| 6,451,514 B1 | 9/2002 | Iitsuka |
| 6,452,742 B1 | 9/2002 | Crue et al. |
| 6,452,765 B1 | 9/2002 | Mahvan et al. |
| 6,456,465 B1 | 9/2002 | Louis et al. |
| 6,459,552 B1 | 10/2002 | Liu et al. |
| 6,462,920 B1 | 10/2002 | Karimi |
| 6,466,401 B1 | 10/2002 | Hong et al. |
| 6,466,402 B1 | 10/2002 | Crue, Jr. et al. |
| 6,466,404 B1 | 10/2002 | Crue, Jr. et al. |
| 6,466,419 B1 | 10/2002 | Mao |
| 6,468,436 B1 | 10/2002 | Shi et al. |
| 6,469,877 B1 | 10/2002 | Knapp et al. |
| 6,477,019 B2 | 11/2002 | Matono et al. |
| 6,479,096 B1 | 11/2002 | Shi et al. |
| 6,483,662 B1 | 11/2002 | Thomas et al. |
| 6,487,040 B1 | 11/2002 | Hsiao et al. |
| 6,487,056 B1 | 11/2002 | Gibbons et al. |
| 6,490,125 B1 | 12/2002 | Barr |
| 6,496,330 B1 | 12/2002 | Crue, Jr. et al. |
| 6,496,334 B1 | 12/2002 | Pang et al. |
| 6,504,676 B1 | 1/2003 | Hiner et al. |
| 6,512,657 B2 | 1/2003 | Heist et al. |
| 6,512,659 B1 | 1/2003 | Hawwa et al. |
| 6,512,661 B1 | 1/2003 | Louis |
| 6,512,690 B1 | 1/2003 | Qi et al. |
| 6,515,573 B1 | 2/2003 | Dong et al. |
| 6,515,791 B1 | 2/2003 | Hawwa et al. |
| 6,532,823 B1 | 3/2003 | Knapp et al. |
| 6,535,363 B1 | 3/2003 | Hosomi et al. |
| 6,552,874 B1 | 4/2003 | Chen et al. |
| 6,552,928 B1 | 4/2003 | Qi et al. |
| 6,577,470 B1 | 6/2003 | Rumpler |
| 6,583,961 B2 | 6/2003 | Levi et al. |
| 6,583,968 B1 | 6/2003 | Scura et al. |
| 6,597,546 B2 | 7/2003 | Gill |
| 6,597,548 B1 | 7/2003 | Yamanaka et al. |
| 6,611,398 B1 | 8/2003 | Rumpler et al. |
| 6,618,223 B1 | 9/2003 | Chen et al. |
| 6,629,357 B1 | 10/2003 | Akoh |
| 6,631,055 B1 | 10/2003 | Childress et al. |
| 6,633,464 B2 | 10/2003 | Lai et al. |
| 6,636,394 B1 | 10/2003 | Fukagawa et al. |
| 6,639,291 B1 | 10/2003 | Sin et al. |
| 6,650,503 B1 | 11/2003 | Chen et al. |
| 6,650,506 B1 | 11/2003 | Risse |
| 6,654,195 B1 | 11/2003 | Frank, Jr. et al. |
| 6,657,816 B1 | 12/2003 | Barr et al. |

(56) References Cited

U.S. PATENT DOCUMENTS

| | | |
|---|---|---|
| 6,661,621 B1 | 12/2003 | Iitsuka |
| 6,661,625 B1 | 12/2003 | Sin et al. |
| 6,674,610 B1 | 1/2004 | Thomas et al. |
| 6,680,828 B2 | 1/2004 | Gill |
| 6,680,830 B2 | 1/2004 | Gill |
| 6,680,863 B1 | 1/2004 | Shi et al. |
| 6,683,763 B1 | 1/2004 | Hiner et al. |
| 6,687,098 B1 | 2/2004 | Huai |
| 6,687,178 B1 | 2/2004 | Qi et al. |
| 6,687,977 B2 | 2/2004 | Knapp et al. |
| 6,691,226 B1 | 2/2004 | Frank, Jr. et al. |
| 6,697,294 B1 | 2/2004 | Qi et al. |
| 6,700,738 B1 | 3/2004 | Sin et al. |
| 6,700,759 B1 | 3/2004 | Knapp et al. |
| 6,704,158 B2 | 3/2004 | Hawwa et al. |
| 6,707,083 B1 | 3/2004 | Hiner et al. |
| 6,713,801 B1 | 3/2004 | Sin et al. |
| 6,721,138 B1 | 4/2004 | Chen et al. |
| 6,721,149 B1 | 4/2004 | Shi et al. |
| 6,721,203 B1 | 4/2004 | Qi et al. |
| 6,724,569 B1 | 4/2004 | Chen et al. |
| 6,724,572 B1 | 4/2004 | Stoev et al. |
| 6,724,584 B2 | 4/2004 | Mack et al. |
| 6,729,015 B2 | 5/2004 | Matono et al. |
| 6,735,850 B1 | 5/2004 | Gibbons et al. |
| 6,737,281 B1 | 5/2004 | Dang et al. |
| 6,738,236 B1 | 5/2004 | Mao et al. |
| 6,738,237 B2 | 5/2004 | Gill |
| 6,741,432 B2 | 5/2004 | Pinarbasi |
| 6,744,607 B2 | 6/2004 | Freitag et al. |
| 6,744,608 B1 | 6/2004 | Chen et al. |
| 6,747,301 B1 | 6/2004 | Hiner et al. |
| 6,751,055 B1 | 6/2004 | Alfoqaha et al. |
| 6,751,845 B2 | 6/2004 | Gill |
| 6,754,049 B1 | 6/2004 | Seagle et al. |
| 6,756,071 B1 | 6/2004 | Shi et al. |
| 6,757,140 B1 | 6/2004 | Hawwa |
| 6,760,196 B1 | 7/2004 | Niu et al. |
| 6,762,910 B1 | 7/2004 | Knapp et al. |
| 6,765,756 B1 | 7/2004 | Hong et al. |
| 6,775,902 B1 | 8/2004 | Huai et al. |
| 6,778,358 B1 | 8/2004 | Jiang et al. |
| 6,781,798 B2 | 8/2004 | Gill |
| 6,781,927 B1 | 8/2004 | Heanuc et al. |
| 6,785,102 B2 | 8/2004 | Freitag et al. |
| 6,785,955 B1 | 9/2004 | Chen et al. |
| 6,791,793 B1 | 9/2004 | Chen et al. |
| 6,791,807 B1 | 9/2004 | Hikami et al. |
| 6,798,616 B1 | 9/2004 | Seagle et al. |
| 6,798,625 B1 | 9/2004 | Ueno et al. |
| 6,801,408 B1 | 10/2004 | Chen et al. |
| 6,801,411 B1 | 10/2004 | Lederman et al. |
| 6,801,412 B2 | 10/2004 | Gill |
| 6,803,615 B1 | 10/2004 | Sin et al. |
| 6,806,035 B1 | 10/2004 | Atireklapvarodom et al. |
| 6,807,030 B1 | 10/2004 | Hawwa et al. |
| 6,807,332 B1 | 10/2004 | Hawwa |
| 6,809,899 B1 | 10/2004 | Chen et al. |
| 6,816,345 B1 | 11/2004 | Knapp et al. |
| 6,828,897 B1 | 12/2004 | Nepela |
| 6,829,160 B1 | 12/2004 | Qi et al. |
| 6,829,819 B1 | 12/2004 | Crue, Jr. et al. |
| 6,833,979 B1 | 12/2004 | Knapp et al. |
| 6,833,982 B2 | 12/2004 | Jayasekara |
| 6,834,010 B1 | 12/2004 | Qi et al. |
| 6,847,510 B2 | 1/2005 | Childress et al. |
| 6,856,493 B2 | 2/2005 | Pinarbasi |
| 6,859,343 B1 | 2/2005 | Alfoqaha et al. |
| 6,859,348 B2 | 2/2005 | Pinarbasi |
| 6,859,997 B1 | 3/2005 | Tong et al. |
| 6,861,937 B1 | 3/2005 | Feng et al. |
| 6,865,062 B2 | 3/2005 | Pinarbasi |
| 6,867,952 B2 | 3/2005 | Hasegawa |
| 6,867,953 B2 | 3/2005 | Gill |
| 6,870,712 B2 | 3/2005 | Chen et al. |
| 6,873,494 B2 | 3/2005 | Chen et al. |
| 6,873,547 B1 | 3/2005 | Shi et al. |
| 6,879,464 B2 | 4/2005 | Sun et al. |
| 6,888,184 B1 | 5/2005 | Shi et al. |
| 6,888,704 B1 | 5/2005 | Diao et al. |
| 6,891,702 B1 | 5/2005 | Tang |
| 6,894,871 B2 | 5/2005 | Alfoqaha et al. |
| 6,894,877 B1 | 5/2005 | Crue, Jr. et al. |
| 6,901,652 B2 | 6/2005 | Hasegawa et al. |
| 6,906,894 B2 | 6/2005 | Chen et al. |
| 6,909,578 B1 | 6/2005 | Missell et al. |
| 6,912,106 B1 | 6/2005 | Chen et al. |
| 6,933,042 B2 | 8/2005 | Gill |
| 6,934,113 B1 | 8/2005 | Chen |
| 6,934,129 B1 | 8/2005 | Zhang et al. |
| 6,940,688 B2 | 9/2005 | Jiang et al. |
| 6,942,824 B1 | 9/2005 | Li |
| 6,943,993 B2 | 9/2005 | Chang et al. |
| 6,943,997 B2 | 9/2005 | Gill |
| 6,944,938 B1 | 9/2005 | Crue, Jr. et al. |
| 6,947,258 B1 | 9/2005 | Li |
| 6,947,264 B2 | 9/2005 | Gill |
| 6,950,266 B1 | 9/2005 | McCaslin et al. |
| 6,954,332 B1 | 10/2005 | Hong et al. |
| 6,958,885 B1 | 10/2005 | Chen et al. |
| 6,961,221 B1 | 11/2005 | Niu et al. |
| 6,969,989 B1 | 11/2005 | Mei |
| 6,975,486 B2 | 12/2005 | Chen et al. |
| 6,983,530 B2 | 1/2006 | Gill |
| 6,987,643 B1 | 1/2006 | Seagle |
| 6,989,962 B1 | 1/2006 | Dong et al. |
| 6,989,972 B1 | 1/2006 | Stoev et al. |
| 7,006,327 B2 | 2/2006 | Krounbi et al. |
| 7,007,372 B1 | 3/2006 | Chen et al. |
| 7,012,832 B1 | 3/2006 | Sin et al. |
| 7,016,168 B2 | 3/2006 | Li et al. |
| 7,023,658 B1 | 4/2006 | Knapp et al. |
| 7,026,063 B2 | 4/2006 | Ueno et al. |
| 7,027,268 B1 | 4/2006 | Zhu et al. |
| 7,027,274 B1 | 4/2006 | Sin et al. |
| 7,035,046 B1 | 4/2006 | Young et al. |
| 7,035,059 B2 | 4/2006 | Gill |
| 7,035,062 B1 | 4/2006 | Mao et al. |
| 7,037,847 B2 | 5/2006 | Le et al. |
| 7,038,889 B2 | 5/2006 | Freitag et al. |
| 7,041,985 B1 | 5/2006 | Wang et al. |
| 7,046,490 B1 | 5/2006 | Ueno et al. |
| 7,050,277 B2 | 5/2006 | Gill et al. |
| 7,054,113 B1 | 5/2006 | Seagle et al. |
| 7,057,857 B1 | 6/2006 | Niu et al. |
| 7,059,868 B1 | 6/2006 | Yan |
| 7,072,154 B2 | 7/2006 | Gill et al. |
| 7,082,017 B2 | 7/2006 | Freitag et al. |
| 7,092,195 B1 | 8/2006 | Liu et al. |
| 7,092,220 B2 | 8/2006 | Gill et al. |
| 7,092,221 B2 | 8/2006 | Gill |
| 7,094,130 B2 | 8/2006 | Cyrille et al. |
| 7,110,289 B1 | 9/2006 | Sin et al. |
| 7,111,382 B1 | 9/2006 | Knapp et al. |
| 7,113,366 B1 | 9/2006 | Wang et al. |
| 7,114,241 B2 | 10/2006 | Kubota et al. |
| 7,116,517 B1 | 10/2006 | He et al. |
| 7,124,654 B1 | 10/2006 | Davies et al. |
| 7,126,788 B1 | 10/2006 | Liu et al. |
| 7,126,790 B1 | 10/2006 | Liu et al. |
| 7,131,346 B1 | 11/2006 | Buttar et al. |
| 7,133,253 B1 | 11/2006 | Seagle et al. |
| 7,134,185 B1 | 11/2006 | Knapp et al. |
| 7,154,715 B2 | 12/2006 | Yamanaka et al. |
| 7,161,773 B2 | 1/2007 | Fontana, Jr. et al. |
| 7,170,725 B1 | 1/2007 | Zhou et al. |
| 7,171,741 B1 | 2/2007 | Gill |
| 7,177,117 B1 | 2/2007 | Jiang et al. |
| 7,177,120 B2 | 2/2007 | Freitag et al. |
| 7,193,815 B1 | 3/2007 | Stoev et al. |
| 7,196,878 B2 | 3/2007 | Fox et al. |
| 7,196,880 B1 | 3/2007 | Anderson et al. |
| 7,199,974 B1 | 4/2007 | Alfoqaha |
| 7,199,975 B1 | 4/2007 | Pan |

(56) References Cited

U.S. PATENT DOCUMENTS

| | | |
|---|---|---|
| 7,211,339 B1 | 5/2007 | Seagle et al. |
| 7,212,384 B1 | 5/2007 | Stoev et al. |
| 7,220,499 B2 | 5/2007 | Saito et al. |
| 7,238,292 B1 | 7/2007 | He et al. |
| 7,239,478 B1 | 7/2007 | Sin et al. |
| 7,245,463 B2 | 7/2007 | Gill |
| 7,248,431 B1 | 7/2007 | Liu et al. |
| 7,248,433 B1 | 7/2007 | Stoev et al. |
| 7,248,447 B2 | 7/2007 | Gill |
| 7,248,449 B1 | 7/2007 | Seagle |
| 7,265,946 B2 | 9/2007 | Gill |
| 7,268,980 B2 | 9/2007 | Gill |
| 7,280,325 B1 | 10/2007 | Pan |
| 7,283,327 B1 | 10/2007 | Liu et al. |
| 7,284,316 B1 | 10/2007 | Huai et al. |
| 7,286,329 B1 | 10/2007 | Chen et al. |
| 7,289,303 B1 | 10/2007 | Sin et al. |
| 7,292,409 B1 | 11/2007 | Stoev et al. |
| 7,296,339 B1 | 11/2007 | Yang et al. |
| 7,307,814 B1 | 12/2007 | Seagle et al. |
| 7,307,818 B1 | 12/2007 | Park et al. |
| 7,310,204 B1 | 12/2007 | Stoev et al. |
| 7,313,856 B2 | 1/2008 | Gill |
| 7,318,947 B1 | 1/2008 | Park et al. |
| 7,324,310 B2 | 1/2008 | Gill |
| 7,330,339 B2 | 2/2008 | Gill |
| 7,333,295 B1 | 2/2008 | Medina et al. |
| 7,337,530 B1 | 3/2008 | Stoev et al. |
| 7,342,752 B1 | 3/2008 | Zhang et al. |
| 7,345,854 B2 | 3/2008 | Takano |
| 7,349,170 B1 | 3/2008 | Rudman et al. |
| 7,349,179 B1 | 3/2008 | He et al. |
| 7,354,664 B1 | 4/2008 | Jiang et al. |
| 7,363,697 B1 | 4/2008 | Dunn et al. |
| 7,365,949 B2 | 4/2008 | Hayakawa et al. |
| 7,369,371 B2 | 5/2008 | Freitag et al. |
| 7,370,404 B2 | 5/2008 | Gill et al. |
| 7,371,152 B1 | 5/2008 | Newman |
| 7,372,665 B1 | 5/2008 | Stoev et al. |
| 7,372,674 B2 | 5/2008 | Gill |
| 7,375,926 B1 | 5/2008 | Stoev et al. |
| 7,379,269 B1 | 5/2008 | Krounbi et al. |
| 7,382,589 B2 | 6/2008 | Lin et al. |
| 7,386,933 B1 | 6/2008 | Krounbi et al. |
| 7,389,577 B1 | 6/2008 | Shang et al. |
| 7,405,908 B2 | 7/2008 | Gill |
| 7,405,909 B2 | 7/2008 | Gill |
| 7,417,832 B1 | 8/2008 | Erickson et al. |
| 7,419,610 B2 | 9/2008 | Cyrille et al. |
| 7,419,891 B1 | 9/2008 | Chen et al. |
| 7,420,787 B2 | 9/2008 | Freitag et al. |
| 7,420,788 B2 | 9/2008 | Pinarbasi |
| 7,428,124 B1 | 9/2008 | Song et al. |
| 7,430,098 B1 | 9/2008 | Song et al. |
| 7,436,620 B1 | 10/2008 | Kang et al. |
| 7,436,637 B2 | 10/2008 | Pinarbasi |
| 7,436,638 B1 | 10/2008 | Pan |
| 7,440,220 B1 | 10/2008 | Kang et al. |
| 7,443,632 B1 | 10/2008 | Stoev et al. |
| 7,444,740 B1 | 11/2008 | Chung et al. |
| 7,463,459 B2 | 12/2008 | Ding et al. |
| 7,466,524 B2 | 12/2008 | Freitag et al. |
| 7,469,465 B2 | 12/2008 | Ding et al. |
| 7,493,688 B1 | 2/2009 | Wang et al. |
| 7,508,627 B1 | 3/2009 | Zhang et al. |
| 7,522,377 B1 | 4/2009 | Jiang et al. |
| 7,522,379 B1 | 4/2009 | Krounbi et al. |
| 7,522,382 B1 | 4/2009 | Pan |
| 7,522,391 B2 | 4/2009 | Freitag et al. |
| 7,522,392 B2 | 4/2009 | Carey et al. |
| 7,542,246 B1 | 6/2009 | Song et al. |
| 7,551,406 B1 | 6/2009 | Thomas et al. |
| 7,552,523 B1 | 6/2009 | He et al. |
| 7,554,767 B1 | 6/2009 | Hu et al. |
| 7,580,230 B2 | 8/2009 | Freitag et al. |
| 7,583,466 B2 | 9/2009 | Kermiche et al. |
| 7,595,967 B1 | 9/2009 | Moon et al. |
| 7,599,155 B2 | 10/2009 | Saito et al. |
| 7,602,589 B2 | 10/2009 | Freitag et al. |
| 7,616,411 B2 | 11/2009 | Gill |
| 7,639,457 B1 | 12/2009 | Chen et al. |
| 7,652,856 B2 | 1/2010 | Pinarbasi |
| 7,660,080 B1 | 2/2010 | Liu et al. |
| 7,663,846 B2 | 2/2010 | Freitag et al. |
| 7,672,080 B1 | 3/2010 | Tang et al. |
| 7,672,086 B1 | 3/2010 | Jiang |
| 7,676,905 B2 | 3/2010 | Pinarbasi |
| 7,684,160 B1 | 3/2010 | Erickson et al. |
| 7,688,546 B1 | 3/2010 | Bai et al. |
| 7,691,434 B1 | 4/2010 | Zhang et al. |
| 7,695,761 B1 | 4/2010 | Shen et al. |
| 7,697,242 B2 | 4/2010 | Gill |
| 7,719,795 B2 | 5/2010 | Hu et al. |
| 7,726,009 B1 | 6/2010 | Liu et al. |
| 7,729,086 B1 | 6/2010 | Song et al. |
| 7,729,087 B1 | 6/2010 | Stoev et al. |
| 7,736,823 B1 | 6/2010 | Wang et al. |
| 7,785,666 B1 | 8/2010 | Sun et al. |
| 7,796,356 B1 | 9/2010 | Fowler et al. |
| 7,800,858 B1 | 9/2010 | Bajikar et al. |
| 7,800,867 B2 | 9/2010 | Saito et al. |
| 7,819,979 B1 | 10/2010 | Chen et al. |
| 7,829,264 B1 | 11/2010 | Wang et al. |
| 7,846,643 B1 | 12/2010 | Sun et al. |
| 7,855,854 B2 | 12/2010 | Hu et al. |
| 7,869,160 B1 | 1/2011 | Pan et al. |
| 7,872,824 B1 | 1/2011 | Macchioni et al. |
| 7,872,833 B2 | 1/2011 | Hu et al. |
| 7,910,267 B1 | 3/2011 | Zeng et al. |
| 7,911,735 B1 | 3/2011 | Sin et al. |
| 7,911,737 B1 | 3/2011 | Jiang et al. |
| 7,916,426 B2 | 3/2011 | Hu et al. |
| 7,916,435 B1 | 3/2011 | Gill |
| 7,918,013 B1 | 4/2011 | Dunn et al. |
| 7,961,440 B2 | 6/2011 | Gill et al. |
| 7,968,219 B1 | 6/2011 | Jiang et al. |
| 7,982,989 B1 | 7/2011 | Shi et al. |
| 8,008,912 B1 | 8/2011 | Shang |
| 8,012,804 B1 | 9/2011 | Wang et al. |
| 8,015,692 B1 | 9/2011 | Zhang et al. |
| 8,018,677 B1 | 9/2011 | Chung et al. |
| 8,018,678 B1 | 9/2011 | Zhang et al. |
| 8,024,748 B1 | 9/2011 | Moravec et al. |
| 8,068,317 B2 | 11/2011 | Gill |
| 8,072,705 B1 | 12/2011 | Wang et al. |
| 8,074,345 B1 | 12/2011 | Anguelouch et al. |
| 8,077,418 B1 | 12/2011 | Hu et al. |
| 8,077,434 B1 | 12/2011 | Shen et al. |
| 8,077,435 B1 | 12/2011 | Liu et al. |
| 8,077,557 B1 | 12/2011 | Hu et al. |
| 8,079,135 B1 | 12/2011 | Shen et al. |
| 8,081,403 B1 | 12/2011 | Chen et al. |
| 8,091,210 B1 | 1/2012 | Sasaki et al. |
| 8,097,846 B1 | 1/2012 | Anguelouch et al. |
| 8,104,166 B1 | 1/2012 | Zhang et al. |
| 8,116,043 B2 | 2/2012 | Leng et al. |
| 8,116,171 B1 | 2/2012 | Lee |
| 8,125,856 B1 | 2/2012 | Li et al. |
| 8,134,794 B1 | 3/2012 | Wang |
| 8,136,224 B1 | 3/2012 | Sun et al. |
| 8,136,225 B1 | 3/2012 | Zhang et al. |
| 8,136,805 B1 | 3/2012 | Lee |
| 8,141,235 B1 | 3/2012 | Zhang |
| 8,146,236 B1 | 4/2012 | Luo et al. |
| 8,149,536 B1 | 4/2012 | Yang et al. |
| 8,149,548 B2 | 4/2012 | Hatatani et al. |
| 8,151,441 B1 | 4/2012 | Rudy et al. |
| 8,163,185 B1 | 4/2012 | Sun et al. |
| 8,164,760 B2 | 4/2012 | Willis |
| 8,164,855 B1 | 4/2012 | Gibbons et al. |
| 8,164,864 B2 | 4/2012 | Kaiser et al. |
| 8,165,709 B1 | 4/2012 | Rudy |
| 8,166,631 B1 | 5/2012 | Tran et al. |
| 8,166,632 B1 | 5/2012 | Zhang et al. |

(56) References Cited

U.S. PATENT DOCUMENTS

| | | |
|---|---|---|
| 8,169,473 B1 | 5/2012 | Yu et al. |
| 8,171,618 B1 | 5/2012 | Wang et al. |
| 8,179,636 B1 | 5/2012 | Bai et al. |
| 8,191,237 B1 | 6/2012 | Luo et al. |
| 8,194,365 B1 | 6/2012 | Leng et al. |
| 8,194,366 B1 | 6/2012 | Li et al. |
| 8,196,285 B1 | 6/2012 | Zhang et al. |
| 8,200,054 B1 | 6/2012 | Li et al. |
| 8,203,800 B2 | 6/2012 | Li et al. |
| 8,208,350 B1 | 6/2012 | Hu et al. |
| 8,220,140 B1 | 7/2012 | Wang et al. |
| 8,222,599 B1 | 7/2012 | Chien |
| 8,225,488 B1 | 7/2012 | Zhang et al. |
| 8,227,023 B1 | 7/2012 | Liu et al. |
| 8,228,633 B1 | 7/2012 | Tran et al. |
| 8,231,796 B1 | 7/2012 | Li et al. |
| 8,233,248 B1 | 7/2012 | Li et al. |
| 8,248,896 B1 | 8/2012 | Yuan et al. |
| 8,254,060 B1 | 8/2012 | Shi et al. |
| 8,257,597 B1 | 9/2012 | Guan et al. |
| 8,259,410 B1 | 9/2012 | Bai et al. |
| 8,259,539 B1 | 9/2012 | Hu et al. |
| 8,262,918 B1 | 9/2012 | Li et al. |
| 8,262,919 B1 | 9/2012 | Luo et al. |
| 8,264,797 B2 | 9/2012 | Emley |
| 8,264,798 B1 | 9/2012 | Guan et al. |
| 8,266,785 B2 | 9/2012 | Freitag et al. |
| 8,270,126 B1 | 9/2012 | Roy et al. |
| 8,276,258 B1 | 10/2012 | Tran et al. |
| 8,277,669 B1 | 10/2012 | Chen et al. |
| 8,279,719 B1 | 10/2012 | Hu et al. |
| 8,284,517 B1 | 10/2012 | Sun et al. |
| 8,288,204 B1 | 10/2012 | Wang et al. |
| 8,289,821 B1 | 10/2012 | Huber |
| 8,291,743 B1 | 10/2012 | Shi et al. |
| 8,307,539 B1 | 11/2012 | Rudy et al. |
| 8,307,540 B1 | 11/2012 | Tran et al. |
| 8,308,921 B1 | 11/2012 | Hiner et al. |
| 8,310,785 B1 | 11/2012 | Zhang et al. |
| 8,310,901 B1 | 11/2012 | Batra et al. |
| 8,315,019 B1 | 11/2012 | Mao et al. |
| 8,316,527 B2 | 11/2012 | Hong et al. |
| 8,318,030 B2 | 11/2012 | Peng et al. |
| 8,320,076 B1 | 11/2012 | Shen et al. |
| 8,320,077 B1 | 11/2012 | Tang et al. |
| 8,320,219 B1 | 11/2012 | Wolf et al. |
| 8,320,220 B1 | 11/2012 | Yuan et al. |
| 8,320,722 B1 | 11/2012 | Yuan et al. |
| 8,322,022 B1 | 12/2012 | Yi et al. |
| 8,322,023 B1 | 12/2012 | Zeng et al. |
| 8,325,569 B1 | 12/2012 | Shi et al. |
| 8,333,008 B1 | 12/2012 | Sin et al. |
| 8,333,898 B2 | 12/2012 | Brown et al. |
| 8,334,093 B2 | 12/2012 | Zhang et al. |
| 8,336,194 B2 | 12/2012 | Yuan et al. |
| 8,339,738 B1 | 12/2012 | Tran et al. |
| 8,341,826 B1 | 1/2013 | Jiang et al. |
| 8,343,319 B1 | 1/2013 | Li et al. |
| 8,343,364 B1 | 1/2013 | Gao et al. |
| 8,349,195 B1 | 1/2013 | Si et al. |
| 8,351,307 B1 | 1/2013 | Wolf et al. |
| 8,357,244 B1 | 1/2013 | Zhao et al. |
| 8,373,945 B1 | 2/2013 | Luo et al. |
| 8,375,564 B1 | 2/2013 | Luo et al. |
| 8,375,565 B2 | 2/2013 | Hu et al. |
| 8,381,391 B2 | 2/2013 | Park et al. |
| 8,385,157 B1 | 2/2013 | Champion et al. |
| 8,385,158 B1 | 2/2013 | Hu et al. |
| 8,394,280 B1 | 3/2013 | Wan et al. |
| 8,400,731 B1 | 3/2013 | Li et al. |
| 8,400,738 B2 | 3/2013 | Covington et al. |
| 8,404,128 B1 | 3/2013 | Zhang et al. |
| 8,404,129 B1 | 3/2013 | Luo et al. |
| 8,405,930 B1 | 3/2013 | Li et al. |
| 8,409,453 B1 | 4/2013 | Jiang et al. |
| 8,413,317 B1 | 4/2013 | Wan et al. |
| 8,416,540 B1 | 4/2013 | Li et al. |
| 8,419,953 B1 | 4/2013 | Su et al. |
| 8,419,954 B1 | 4/2013 | Chen et al. |
| 8,422,176 B1 | 4/2013 | Leng et al. |
| 8,422,342 B1 | 4/2013 | Lee |
| 8,422,841 B1 | 4/2013 | Shi et al. |
| 8,424,192 B1 | 4/2013 | Yang et al. |
| 8,441,756 B1 | 5/2013 | Sun et al. |
| 8,443,510 B1 | 5/2013 | Shi et al. |
| 8,444,866 B1 | 5/2013 | Guan et al. |
| 8,449,948 B2 | 5/2013 | Medina et al. |
| 8,451,556 B1 | 5/2013 | Wang et al. |
| 8,451,563 B1 | 5/2013 | Zhang et al. |
| 8,454,846 B1 | 6/2013 | Zhou et al. |
| 8,455,119 B1 | 6/2013 | Jiang et al. |
| 8,456,961 B1 | 6/2013 | Wang et al. |
| 8,456,963 B1 | 6/2013 | Hu et al. |
| 8,456,964 B1 | 6/2013 | Yuan et al. |
| 8,456,966 B1 | 6/2013 | Shi et al. |
| 8,456,967 B1 | 6/2013 | Mallary |
| 8,458,892 B2 | 6/2013 | Si et al. |
| 8,462,592 B1 | 6/2013 | Wolf et al. |
| 8,468,682 B1 | 6/2013 | Zhang |
| 8,472,288 B1 | 6/2013 | Wolf et al. |
| 8,480,911 B1 | 7/2013 | Osugi et al. |
| 8,486,285 B2 | 7/2013 | Zhou et al. |
| 8,486,286 B1 | 7/2013 | Gao et al. |
| 8,488,272 B1 | 7/2013 | Tran et al. |
| 8,491,801 B1 | 7/2013 | Tanner et al. |
| 8,491,802 B1 | 7/2013 | Gao et al. |
| 8,493,693 B1 | 7/2013 | Zheng et al. |
| 8,493,695 B1 | 7/2013 | Kaiser et al. |
| 8,495,813 B1 | 7/2013 | Hu et al. |
| 8,498,084 B1 | 7/2013 | Leng et al. |
| 8,506,828 B1 | 8/2013 | Osugi et al. |
| 8,514,517 B1 | 8/2013 | Batra et al. |
| 8,518,279 B1 | 8/2013 | Wang et al. |
| 8,518,832 B1 | 8/2013 | Yang et al. |
| 8,520,336 B1 | 8/2013 | Liu et al. |
| 8,520,337 B1 | 8/2013 | Liu et al. |
| 8,524,068 B2 | 9/2013 | Medina et al. |
| 8,526,275 B1 | 9/2013 | Yuan et al. |
| 8,531,801 B1 | 9/2013 | Xiao et al. |
| 8,532,450 B1 | 9/2013 | Wang et al. |
| 8,533,937 B1 | 9/2013 | Wang et al. |
| 8,537,494 B1 | 9/2013 | Pan et al. |
| 8,537,495 B1 | 9/2013 | Luo et al. |
| 8,537,502 B1 | 9/2013 | Park et al. |
| 8,545,999 B1 | 10/2013 | Leng et al. |
| 8,547,659 B1 | 10/2013 | Bai et al. |
| 8,547,667 B1 | 10/2013 | Roy et al. |
| 8,547,730 B1 | 10/2013 | Shen et al. |
| 8,555,486 B1 | 10/2013 | Medina et al. |
| 8,559,141 B1 | 10/2013 | Pakala et al. |
| 8,563,146 B1 | 10/2013 | Zhang et al. |
| 8,565,049 B1 | 10/2013 | Tanner et al. |
| 8,576,517 B1 | 11/2013 | Tran et al. |
| 8,578,594 B2 | 11/2013 | Jiang et al. |
| 8,582,238 B1 | 11/2013 | Liu et al. |
| 8,582,241 B1 | 11/2013 | Yu et al. |
| 8,582,249 B2 * | 11/2013 | Sapozhnikov et al. .. 360/324.11 |
| 8,582,253 B1 | 11/2013 | Zheng et al. |
| 8,588,039 B1 | 11/2013 | Shi et al. |
| 8,593,914 B2 | 11/2013 | Wang et al. |
| 8,597,528 B1 | 12/2013 | Roy et al. |
| 8,599,520 B1 | 12/2013 | Liu et al. |
| 8,599,657 B1 | 12/2013 | Lee |
| 8,603,593 B1 | 12/2013 | Roy et al. |
| 8,607,438 B1 | 12/2013 | Gao et al. |
| 8,607,439 B1 | 12/2013 | Wang et al. |
| 8,611,035 B1 | 12/2013 | Bajikar et al. |
| 8,611,054 B1 | 12/2013 | Shang et al. |
| 8,611,055 B1 | 12/2013 | Pakala et al. |
| 8,614,864 B1 | 12/2013 | Hong et al. |
| 8,619,512 B1 | 12/2013 | Yuan et al. |
| 8,625,233 B1 | 1/2014 | Ji et al. |
| 8,625,941 B1 | 1/2014 | Shi et al. |
| 8,628,672 B1 | 1/2014 | Si et al. |

(56) References Cited

U.S. PATENT DOCUMENTS

| | | |
|---|---|---|
| 8,630,068 B1 | 1/2014 | Mauri et al. |
| 8,634,280 B1 | 1/2014 | Wang et al. |
| 8,638,529 B1 | 1/2014 | Leng et al. |
| 8,643,980 B1 | 2/2014 | Fowler et al. |
| 8,649,123 B1 | 2/2014 | Zhang et al. |
| 8,665,561 B1 | 3/2014 | Knutson et al. |
| 8,670,211 B1 | 3/2014 | Sun et al. |
| 8,670,213 B1 | 3/2014 | Zeng et al. |
| 8,670,214 B1 | 3/2014 | Knutson et al. |
| 8,670,294 B1 | 3/2014 | Shi et al. |
| 8,670,295 B1 | 3/2014 | Hu et al. |
| 8,675,318 B1 | 3/2014 | Ho et al. |
| 8,675,455 B1 | 3/2014 | Krichevsky et al. |
| 8,681,594 B1 | 3/2014 | Shi et al. |
| 8,689,430 B1 | 4/2014 | Chen et al. |
| 8,693,141 B1 | 4/2014 | Elliott et al. |
| 8,703,397 B1 | 4/2014 | Zeng et al. |
| 8,705,205 B1 | 4/2014 | Li et al. |
| 8,711,518 B1 | 4/2014 | Zeng et al. |
| 8,711,528 B1 | 4/2014 | Xiao et al. |
| 8,717,709 B1 | 5/2014 | Shi et al. |
| 8,720,044 B1 | 5/2014 | Tran et al. |
| 8,721,902 B1 | 5/2014 | Wang et al. |
| 8,724,259 B1 | 5/2014 | Liu et al. |
| 8,749,790 B1 | 6/2014 | Tanner et al. |
| 8,749,920 B1 | 6/2014 | Knutson et al. |
| 8,753,903 B1 | 6/2014 | Tanner et al. |
| 8,760,807 B1 | 6/2014 | Zhang et al. |
| 8,760,818 B1 | 6/2014 | Diao et al. |
| 8,760,819 B1 | 6/2014 | Liu et al. |
| 8,760,822 B1 | 6/2014 | Li et al. |
| 8,760,823 B1 | 6/2014 | Chen et al. |
| 8,763,235 B1 | 7/2014 | Wang et al. |
| 8,780,498 B1 | 7/2014 | Jiang et al. |
| 8,780,505 B1 | 7/2014 | Xiao |
| 8,786,983 B1 | 7/2014 | Liu et al. |
| 8,790,524 B1 | 7/2014 | Luo et al. |
| 8,790,527 B1 | 7/2014 | Luo et al. |
| 8,792,208 B1 | 7/2014 | Liu et al. |
| 8,792,312 B1 | 7/2014 | Wang et al. |
| 8,793,866 B1 | 8/2014 | Zhang et al. |
| 8,797,680 B1 | 8/2014 | Luo et al. |
| 8,797,684 B1 | 8/2014 | Tran et al. |
| 8,797,686 B1 | 8/2014 | Bai et al. |
| 8,797,692 B1 | 8/2014 | Guo et al. |
| 8,813,324 B2 | 8/2014 | Emley et al. |
| 2002/0131219 A1 | 9/2002 | Mack et al. |
| 2003/0123198 A1 | 7/2003 | Sugawara et al. |
| 2003/0179520 A1 | 9/2003 | Hasegawa |
| 2004/0061983 A1 | 4/2004 | Childress et al. |
| 2004/0166368 A1 | 8/2004 | Gill et al. |
| 2005/0270703 A1 * | 12/2005 | Hayakawa et al. ........ 360/324.1 |
| 2006/0023375 A1 | 2/2006 | Gill |
| 2006/0092582 A1 | 5/2006 | Gill et al. |
| 2006/0230601 A1 | 10/2006 | Gill et al. |
| 2006/0232893 A1 | 10/2006 | Gill et al. |
| 2006/0285259 A1 | 12/2006 | Gill et al. |
| 2008/0180863 A1 | 7/2008 | Gill |
| 2009/0086385 A1 | 4/2009 | Gill et al. |
| 2009/0316308 A1 | 12/2009 | Saito et al. |
| 2010/0232072 A1 | 9/2010 | Dimitrov et al. |
| 2010/0290157 A1 | 11/2010 | Zhang et al. |
| 2011/0086240 A1 | 4/2011 | Xiang et al. |
| 2011/0228428 A1 | 9/2011 | Dimitrov et al. |
| 2012/0111826 A1 | 5/2012 | Chen et al. |
| 2012/0134057 A1 | 5/2012 | Song et al. |
| 2012/0216378 A1 | 8/2012 | Emley et al. |
| 2012/0237878 A1 | 9/2012 | Zeng et al. |
| 2012/0276415 A1 | 11/2012 | Sapozhnikov et al. |
| 2012/0298621 A1 | 11/2012 | Gao |
| 2013/0082696 A1 | 4/2013 | Le et al. |
| 2013/0092654 A1 | 4/2013 | Balamane et al. |
| 2013/0216702 A1 | 8/2013 | Kaiser et al. |
| 2013/0216863 A1 | 8/2013 | Li et al. |
| 2013/0257421 A1 | 10/2013 | Shang et al. |
| 2014/0154529 A1 | 6/2014 | Yang et al. |
| 2014/0175050 A1 | 6/2014 | Zhang et al. |

* cited by examiner

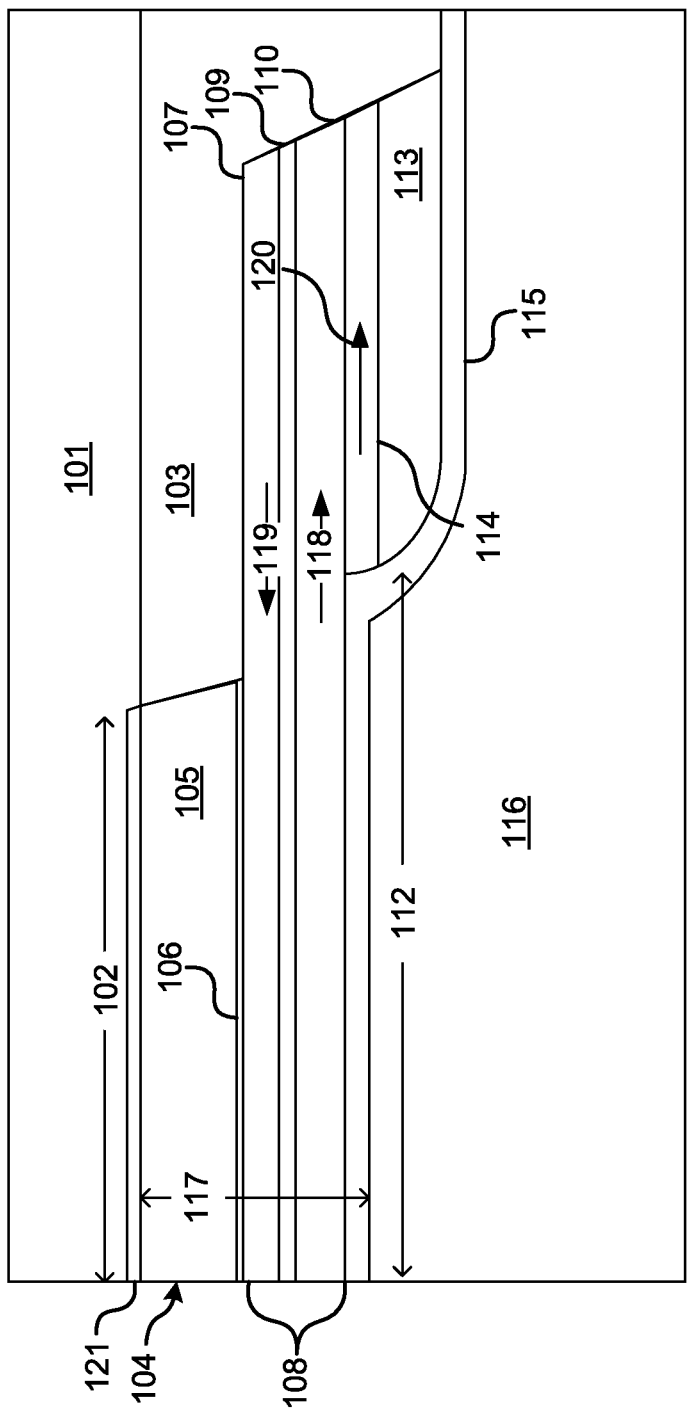

TUNNEL MAGNETORESISTANCE READ HEAD WITH NARROW SHIELD-TO-SHIELD SPACING

CROSS REFERENCE TO RELATED APPLICATION(S)

This application is a divisional application Ser. No. 13/538,650 filed on Jun. 29, 2012, which is hereby incorporated by reference.

TECHNICAL FIELD

This invention relates to the field of disk read/write heads and more specifically, to tunnel magnetoresistance (TMR) read heads and method of fabricating the same.

BACKGROUND

Increasing magnetic recording density requires narrower-track widths and narrower shield-to-shield spacing on read heads. Current tunnel magnetoresistance (TMR) read heads comprise a pinned layer coupled to an antiferromagnet (AFM) layer. The TMR read heads further comprise a free layer separated from the pinned layer by a barrier layer. Current attempts to narrow the shield-to-shield spacing by removing the AFM layer have been unsuccessful because AFM-free TMR read heads are prevalently magnetically bi-directional.

BRIEF DESCRIPTION OF THE DRAWINGS

The present invention is illustrated by way of example, and not limitation, in the figures of the accompanying drawings in which:

FIG. 1 illustrates a read sensor having a tabbed antiferromagnet (AFM) layer and extended pinned layer.

DETAILED DESCRIPTION

Figure 2A:
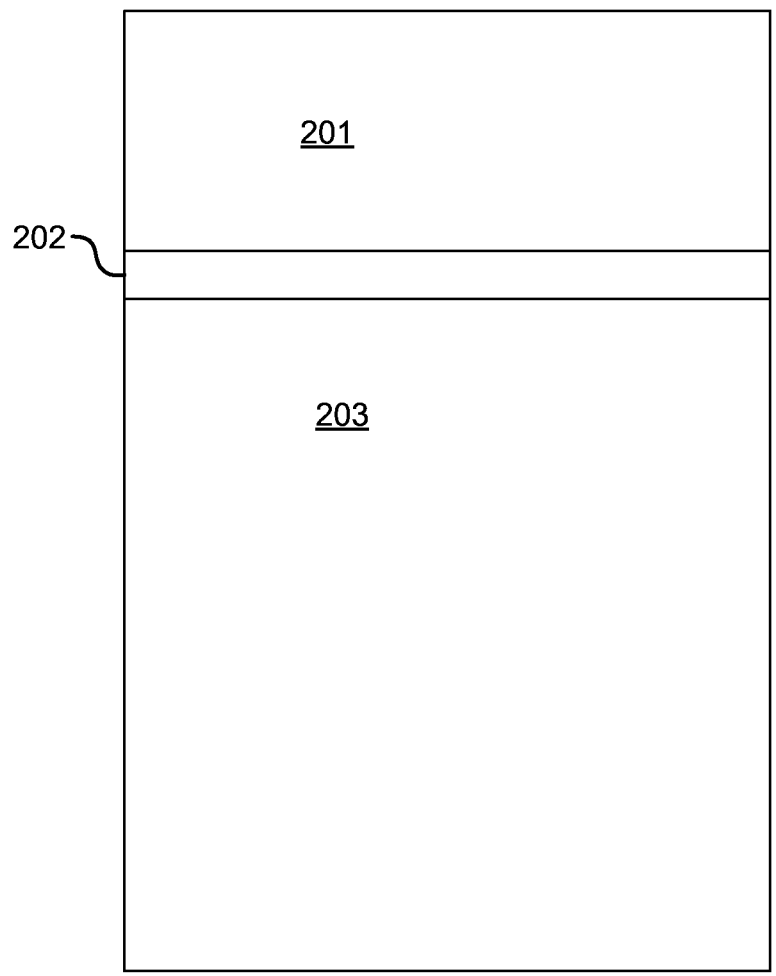
FIGS. 2A-E illustrate a process for manufacturing a read sensor having a tabbed AFM layer and extended pinned layer.

In the following description, numerous specific details are set forth, such as examples of specific layer compositions and properties, to provide a thorough understanding of various embodiment of the present invention. It will be apparent however, to one skilled in the art that these specific details need not be employed to practice various embodiments of the present invention. In other instances, well known components or methods have not been described in detail to avoid unnecessarily obscuring various embodiments of the present invention.

The terms "over," "under," "between," and "on" as used herein refer to a relative position of one media layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

FIG. 1 illustrates a tunnel magnetoresistance (TMR) read sensor having a tabbed AFM layer and an extended pinned layer. The read sensor has an air-bearing surface plane (ABS) 104 and a plurality of layers perpendicular to the ABS 104. A shield layer 116 is disposed over a substrate. The shield layer 116 comprises NiFe or another conventional magnetic shield material for TMR read sensors. In some cases, the shield layer 116 is composed of a single shield material. In other cases, the shield layer 116 has a composite structure. For example, shield layer 116 may comprise one or more layers of NiFe, NiFe multilayers, CoFe, or Ru. A top shield 101 is disposed over the TMR read sensor layers. The top shield layer 101 may also comprise NiFe or other conventional material for TMR read sensors. For example, the top shield 101 may have a composition similar to the lower shield layer 116. The shield-to-shield distance 117 is the distance between the first shield layer 116 and the top layer 101 at the ABS 104.

A seed layer 115 is disposed on the shield layer 116. The seed layer may comprise Ta, Ru, a Ta/Ru bilayer or other conventional seed layers. An antiferromagnetic layer 113 (AFM layer) is disposed over the shield layer 116 on the seed layer 115. An antiferromagnet exchange biased pinned layer 114 (or "stitching layer") is disposed over the AFM layer 113. The AFM layer 113 and stitching layer 114 are recessed from the ABS 104 by a recess distance 112. Because the AFM layer 113 and stitching layer 114 are recessed from the ABS, the layers do not contribute to the shield-to-shield distance 117. In particular cases, the recess distance may be between 10 and 500 nm.

The AFM material layer 113 may comprise various antiferromagnetic materials, such as IrMn, PtMn, PdMn, NiMn, RhMn, or RhRuMn. IrMn is often used in TMR AFM layers because it provides a thinner AFM layer than other materials. Because the AFM layer 113 is recessed 112 from the ABS 104, thicker AFM layers 113 may be employed than in conventional TMR sensors without increasing shield-to-shield distance 117. Accordingly, other antiferromagnetic materials besides IrMn may be used without increasing shield-to-shield distance 117.

The stitching layer 114 is magnetically pinned by the AFM layer 113 in a direction 120. In the illustrated sensor, the stitching layer 114 comprises a layer of CoFe that provides a material transition between the AFM material layer 113 and the pinned layer 108. In other cases, the stitching layer 114 comprises a tri-layer of a first layer of a soft magnetic material such as CoFe, a second layer of Ru, Cr, Ag, or Au, or other suitable non-magnetic material, and a third layer of the soft magnetic material, such as CoFe. The non-magnetic material may a thickness approximately equal to the first or second oscillatory peak of the exchange coupling between the two soft magnetic layer of the multilayer. These thicknesses increase the pinning strength provided by the layer 114. For example, for a CoFe/Ru/CoFe multilayer stitching layer 114, the Ru thickness is either approximately 4.3 Å for the first oscillatory peak or between approximately 7 and 8 Å for the second oscillatory peak. In some cases, the stitching layer 114 may be omitted without impacting the coupling between the AFM layer 113 and the pinned layer 108.

A second pinned layer 108 is disposed on the antiferromagnet exchange biased pinned layer 114 along its area and on the seed layer 115 along the shield 116 contact area. The second pinned layer 108 has its magnetic direction fixed by the stitching layer 114. The second pinned layer 108 extends from the ABS 104 to the rear edge of the first pinned layer 114. The pinned layer 108 may comprise conventional pinned layer materials. For example, the pinned layer 108 may have a composite, multilayer structure including a first ferromagnetic layer 110, a non-magnetic layer 109, and a second ferromagnetic layer 107. The ferromagnetic layers 110 and 107 of pinned layer 108 may be composed of conventional ferromagnetic materials such as NiFe, CoFe, or CoNiFe. The non-magnetic layer 109 may be composed of conventional non-magnetic materials, such as Ru. In the illustrated sensor, the first and second ferromagnetic layers 107, 110 are in an anti-parallel configuration 118, 119, which is fixed by the orientation 120 of the first pinned layer 114.

The TMR read sensor further comprises a free layer 105 separated from the pinned layer 108 by a barrier layer 106 and separated from the top shield layer 101 by a capping layer 121. The barrier layer 106, the capping layer 121, and free layer 105 extend from the ABS 104 to a stripe height distance 102. In some cases, the recess distance 112 is greater than or equal to the stripe height distance 102. In other cases, the recess distance 112 is less than the stripe height distance. The free layer 105 comprises a ferromagnetic material, such as NiFe, CoFe, or CoNiFe. The barrier layer comprises an insulating material, and may be selected to provide a seed layer for the free layer 105. For example, MgO may be used as the barrier layer 106. The capping layer 121 isolates the free layer 105 from the shield layer 101 and comprises a non-magnetic material, such as Ru, Ta, or a bilayer thereof.

A region of conventional insulating substrate material, such as AlOx 103 covers the rear portion of the pinned layer 108 and back of the stitching layer 114 and AFM layer 113. Along with the free layer 105, the material layer 103 provides a planar surface for a shield layer 101. As discussed above, this may comprise NiFe or other conventional material for TMR read sensors.

FIGS. 2A-2E illustrate a first process for making a TMR read head.

The first processing step is illustrated in FIG. 2A. Here, a shield layer 203 is provided on a substrate. A seed layer for the TMR read sensor is deposited on the shield layer 203. In some embodiments, the shield layer 203 may have a composite structure. For example, the shield layer 203 may comprise one or more alternating layers of magnetic shield material and seed layers. The layers of magnetic shield materials may comprise conventional shield materials, such as NiFe. The seed layers may comprise a material that mimic the crystal structure of the magnetic shield materials, such as a layer of CoFeB. Alternatively, the seed layer may comprise an amorphous structure that isolates the grain structure of alternating shield material layers. The TMR seed further comprises a seed layer or layers 202, 201 for the pinned layer. For example, a bilayer of tantalum 202 and ruthenium 201 may be provided as a seed for the pinned layer. As discussed below, a further process step involves cleaning the assembly by material, so the uppermost layer 201 of the seed layer is sufficiently thick so that a proper thickness remains after planarization. In a particular case, the Ta layer 202 may be 10 nm thick and the Ru layer 201 may be 60 nm thick.

Figure 2B:
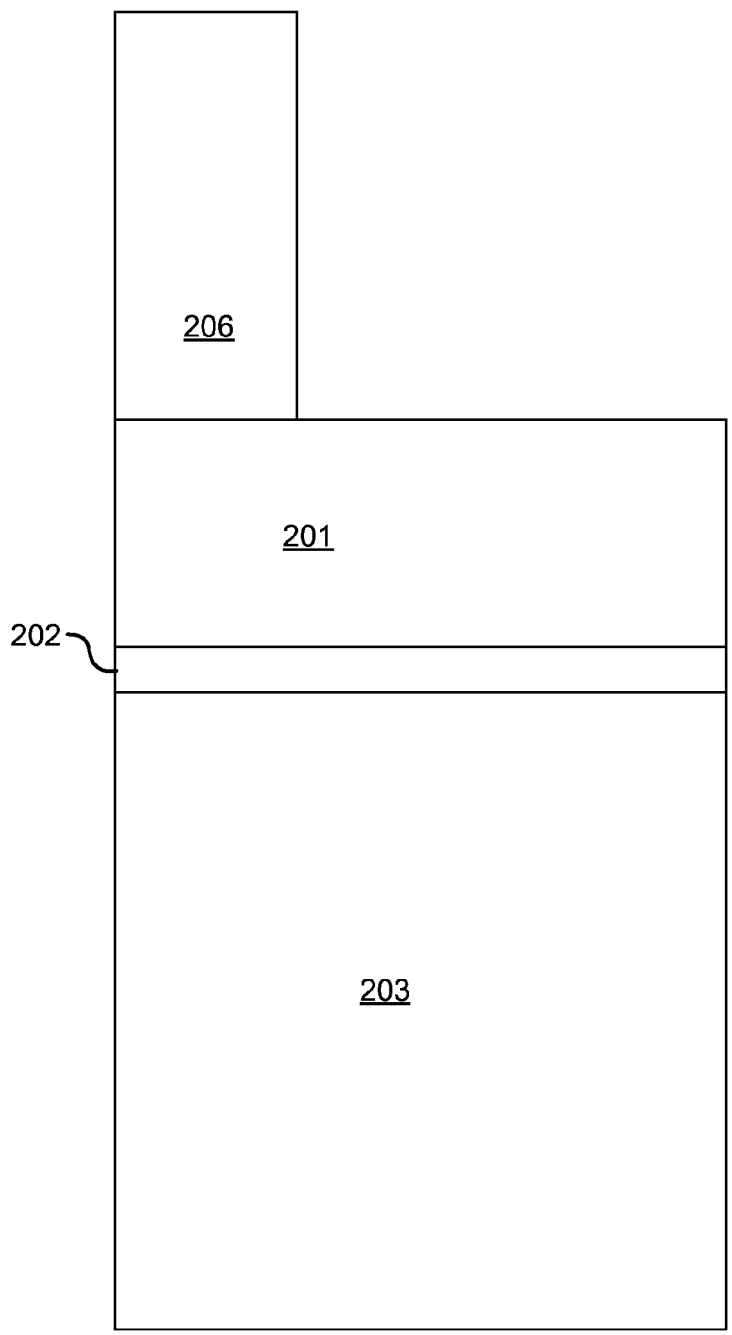

FIG. 2B illustrates a second process step of the first method for making a TMR read head. In this process step a layer of photoresist 206 is formed on the substrate assembly. The photoresist pattern 206 is configured for formation of a region for the AFM layer that is recessed from the ABS.

Figure 2C:
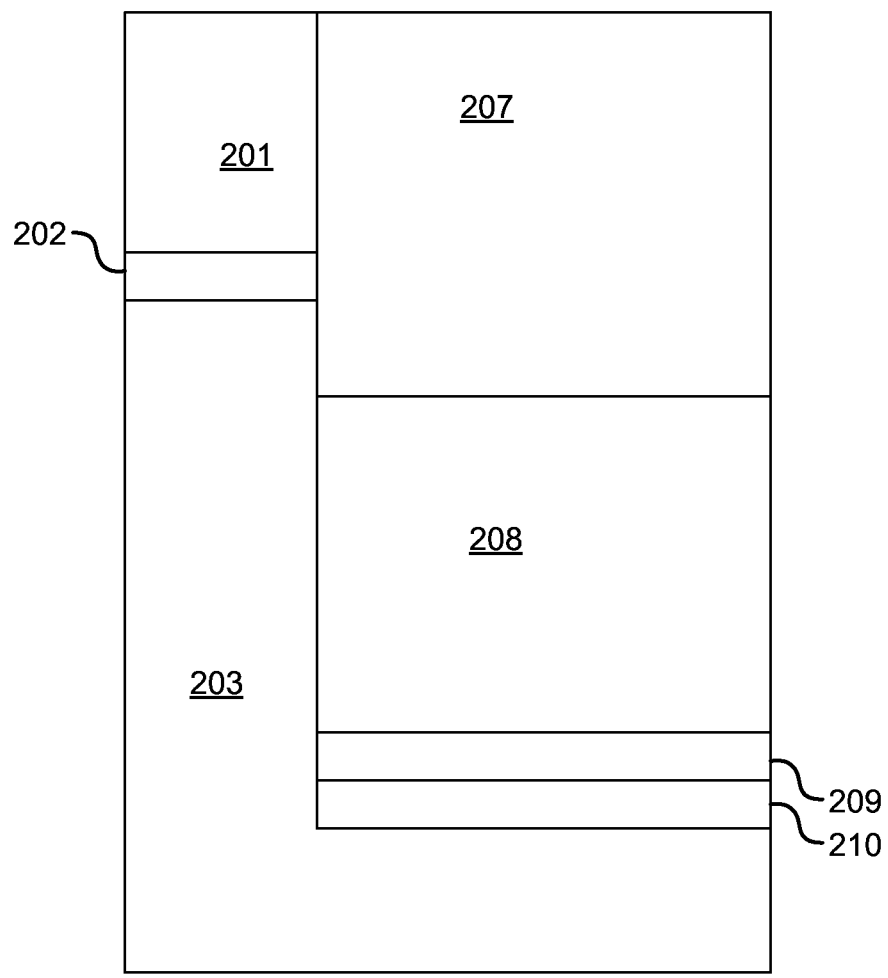

FIG. 2C illustrates a third process step of the first method for making a TMR read head. Here, the substrate assembly is etched to form a region for the AFM and the AFM is deposited in the region. The step of etching comprises etching through the seed layers 201, 202 into the shield layer 203. The depth of penetration into the shield layer is configured according to the desired height of the AFM layer. After deposition, the photoresist pattern 206 is removed. In the illustrated method, the AFM includes an AFM seed layer 210, 209. The AFM seed layer 210, 209 comprises a bilayer of Ta 210 and Ru 209. An AFM material layer 208 is deposited on the seed layer 209, 210. Then, a soft magnetic stitching layer 207 is deposited on the AFM material layer 208. Similar to the thickness of the upper seed layer 201, the thickness for the stitching layer 207 is configured according to the amount of material removal to occur during the subsequent cleaning step.

In a particular case, the first seed layer may comprise 10 nm of Ta, the second seed layer may comprise 10 nm of Ru, the AFM material layer may comprise 80 nm of IrMn, and the stitching layer may comprise 100 nm of CoFe. In this case, the depth of penetration into the shield layer 203 is 130 nm.

Figure 2D:
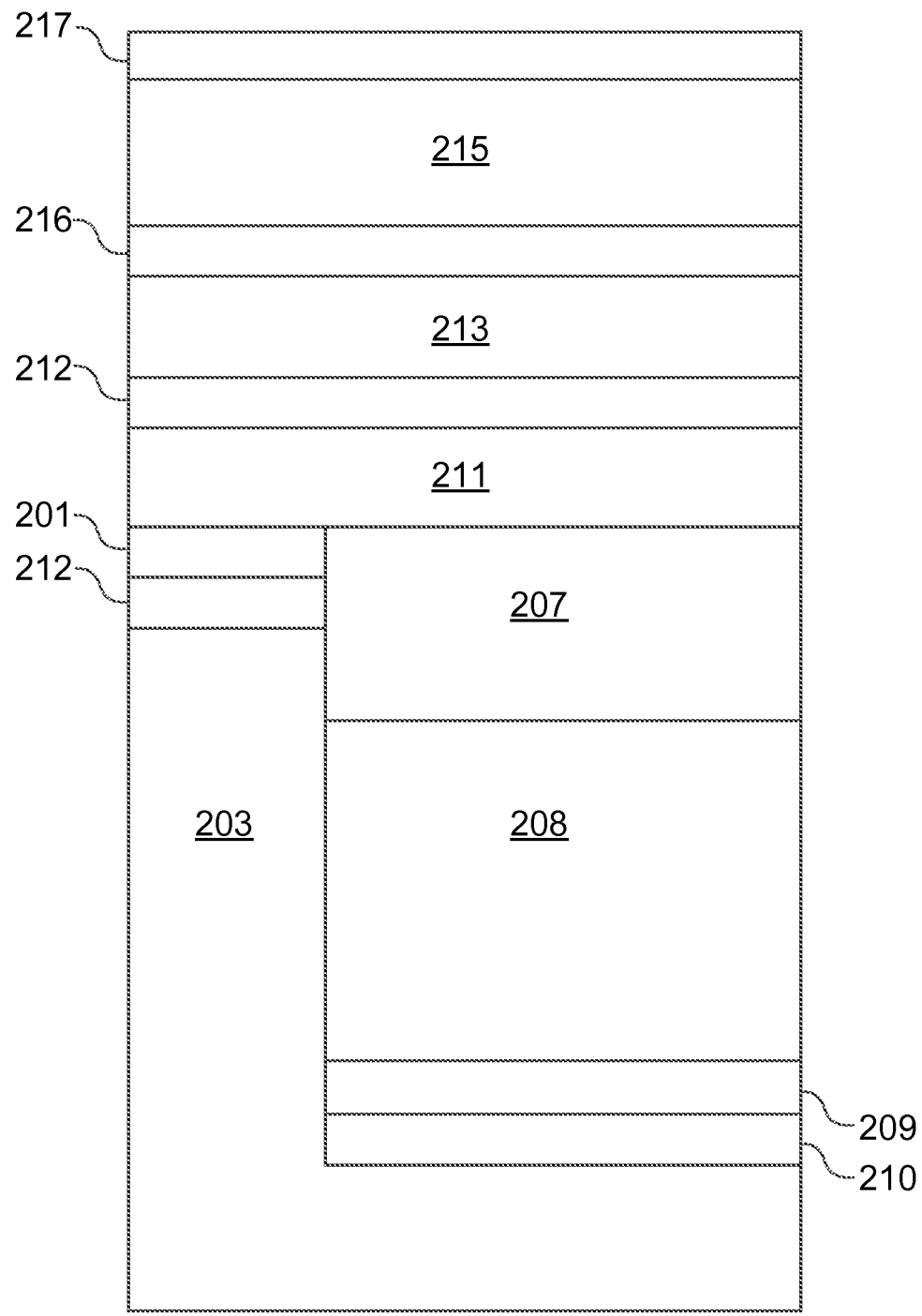

FIG. 2D illustrates a fourth process step of the first method for making a TMR read head. In this process step, the pinned layer, free layer, and attendant layers are deposited on the substrate assembly. First, the upper layers of the assembly are cleaned by removal of some of the material of the layers—for example, by sputter etch clean removal of 50 nm of material. After cleaning, the first magnetic layer 211, the non-magnetic layer 212, and the second magnetic layer 213 are sequentially deposited. The seed layer 216 is then deposited on the second magnetic layer 213. The free layer 215 is deposited on the seed layer 216. Then, the capping layer 217 is deposited on the free layer.

In some cases, after the capping layer 217 is deposited, the assembly is magnetically annealed. Additionally, the manufacture of the assembly up to FIG. 2C may be performed in situ or ex situ with the completion of the assembly in FIG. 2D.

Figure 2E:
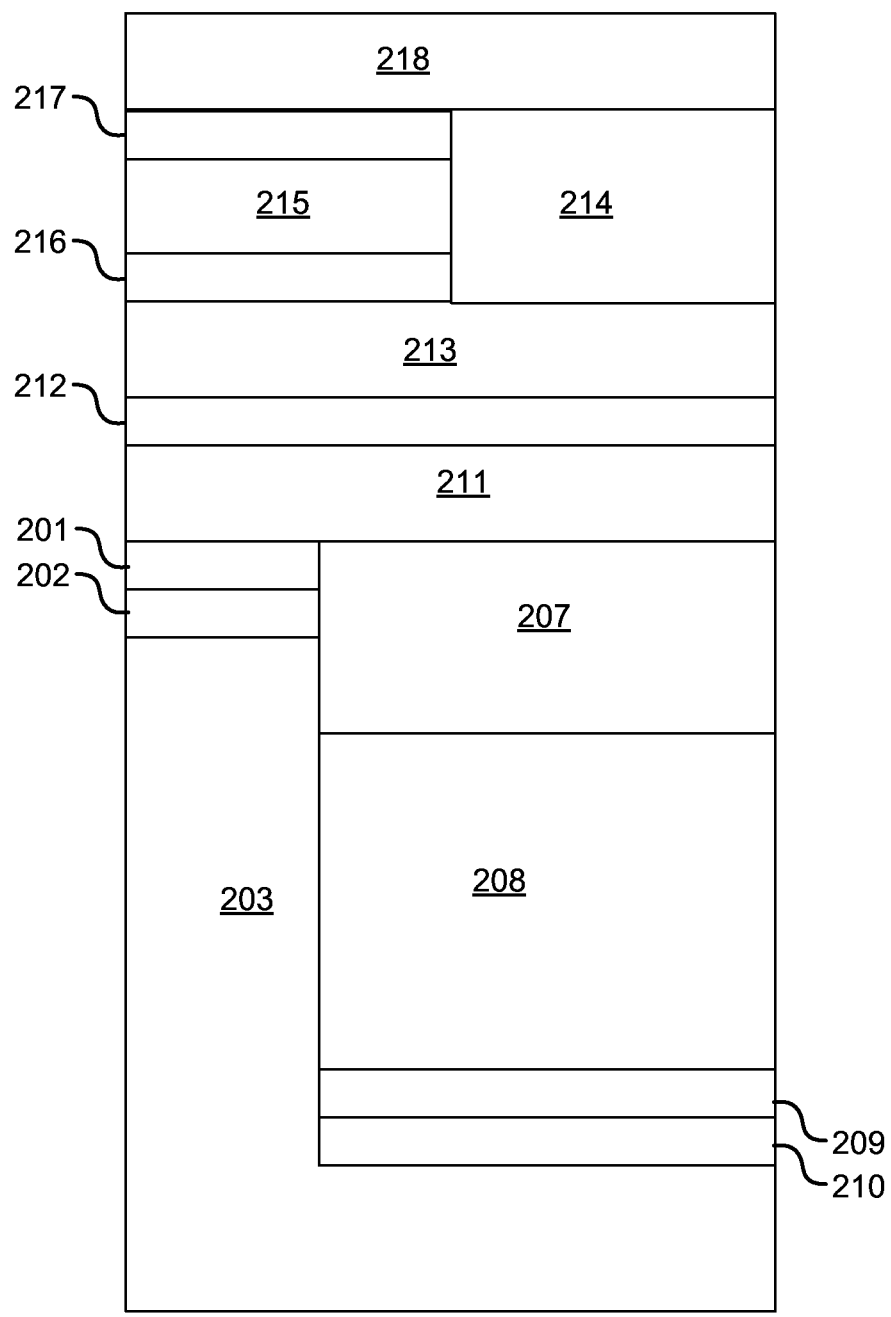

FIG. 2E illustrates a fifth process step of the first method for making the TMR read head. After the deposition of the head layers up to the capping layer 217, conventional subsequent processing is performed on the assembly to define the stripe height and track width. During these subsequent processing steps, the free layer 215, capping layer 217, and seed layer 216 are etched to the proper profile for the track width and stripe height. A filling material 214, such as AlOx is deposited on the substrate to provide a planar region for the upper shield layer 218. Finally, the upper shield layer 218 is deposited on the substrate.

FIGS. 3A-3E illustrate a second method for making a TMR read head.

Figure 3A:
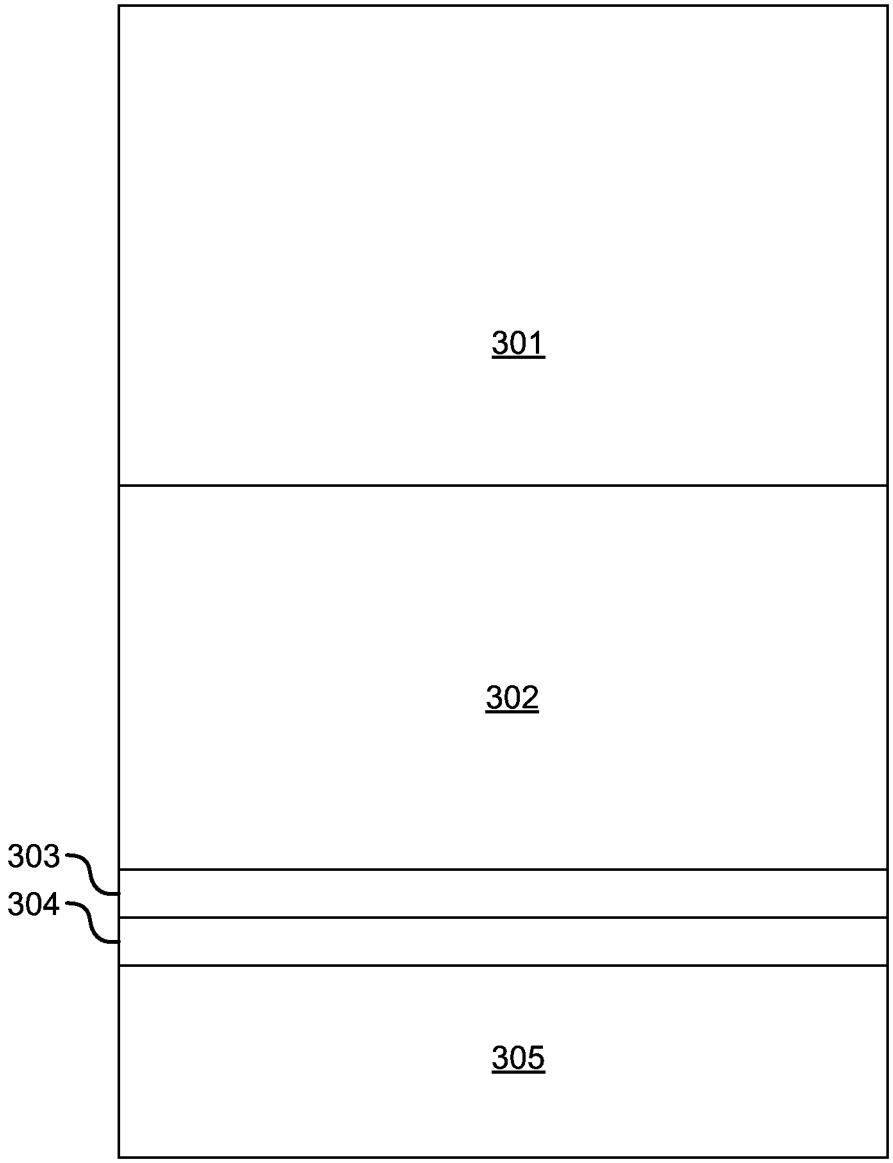
FIGS. 3A-E illustrate a second process for manufacturing a read sensor having a tabbed AFM layer and extended pinned layer.

FIG. 3A illustrates a first process step of the second method of making a TMR read head. The second method begins by depositing the AFM layer on the shield 305. Similar to FIG. 2C, the AFM layer comprises a seed layer 304, 303, such as a Ta/Ru bilayer, an AFM material layer 302 and a soft stitching layer 301. The AFM layer is deposited with similar thicknesses as the AFM layer in FIG. 2C. For example, in a particular case, the AFM film stack comprises 10 nm of Ta 304, 10 nm of Ru 303, 80 nm of IrMn, and 100 nm of CoFe.

Figure 3B:
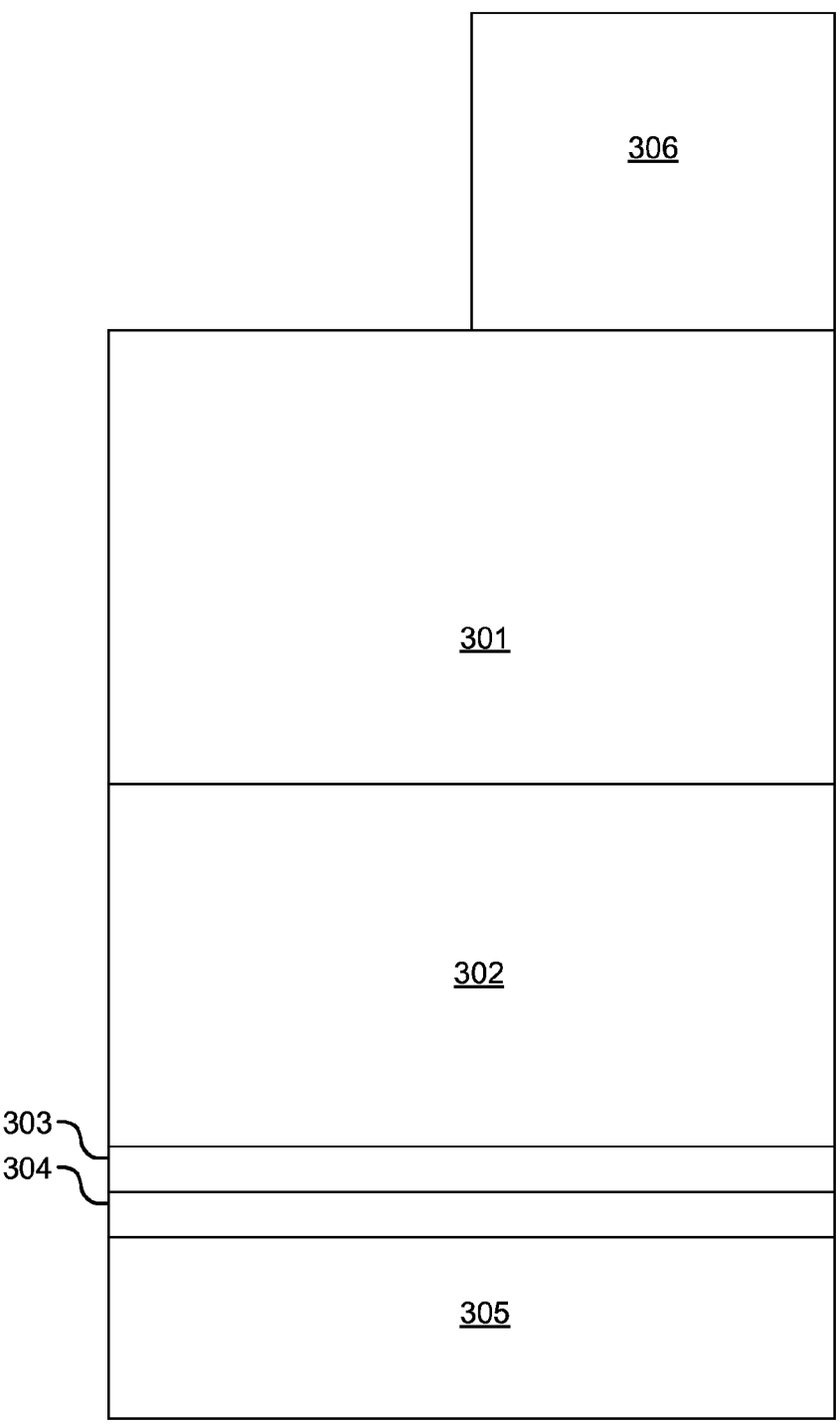

FIG. 3B illustrates a second process step of the second method of making a TMR read head. In this method, a photoresist pattern 306 is formed on the upper layer 301 of the AFM layer. The photoresist pattern 306 is configured to provide a region for formation of a TMR read head seed layer such that the remaining AFM layer is recessed from the ABS.

Figure 3C:
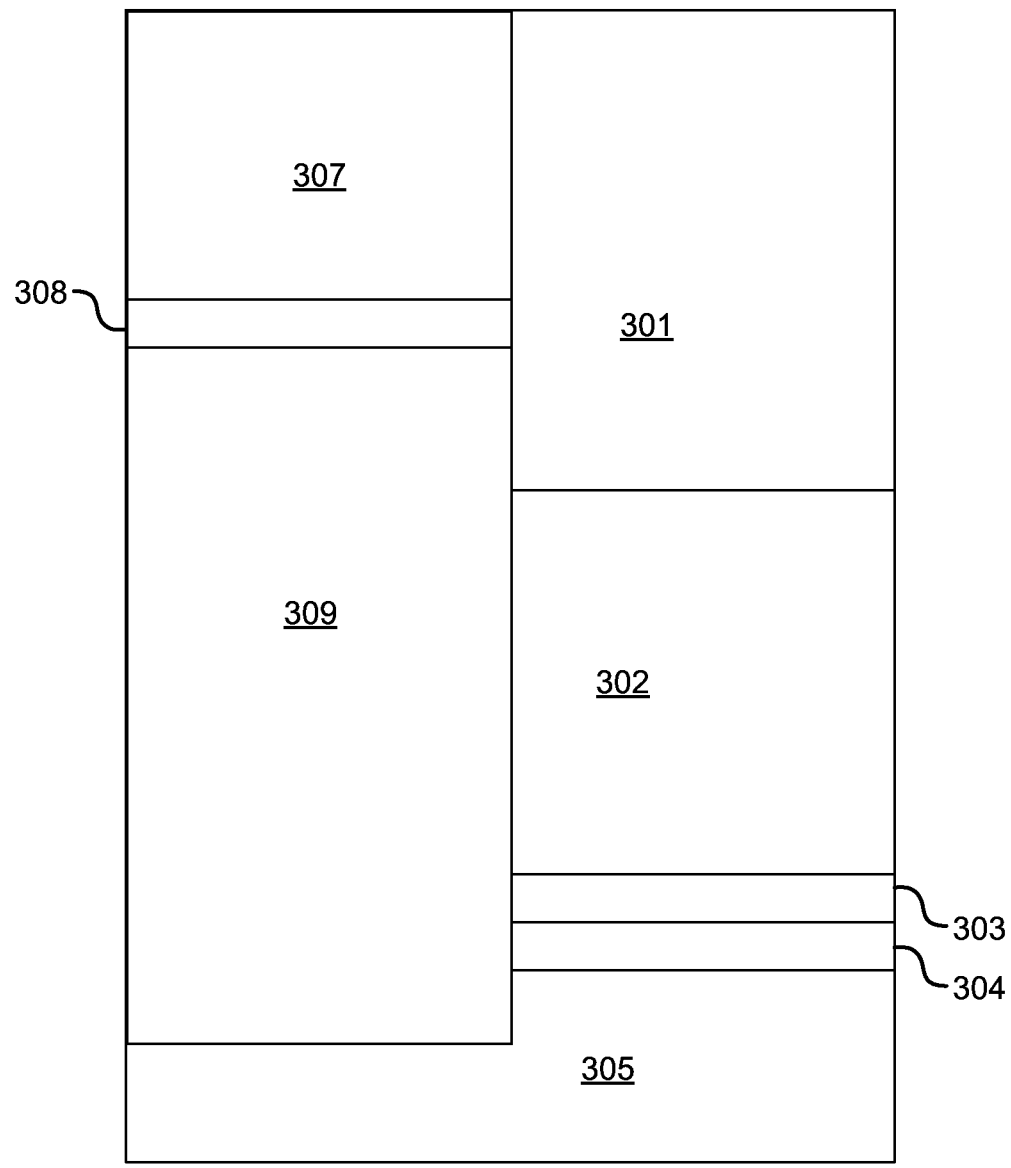

FIG. 3C illustrates a third process step of the second method of making a TMR read head. In this step, the assembly is etched to a predetermined depth into the shield 305. A layer of shield material 309 is deposited in the region to a thickness such that the shield material layer 309 is as thick as that in the second method. A TMR seed bi-layer 308, 307 is then deposited on the shield material layer 309. In some cases, a seed layer, such as a CoFeB layer is deposited on the shield layer 305 prior to the deposition of the shield material layer 309. As with the first method, the second seed layer 307 has a thickness configured for etch cleaning.

In a particular case, the TMR seed layer comprises 150 nm of NiFe, 10 nm of Ta and 60 nm of Ru.

Figure 3D:
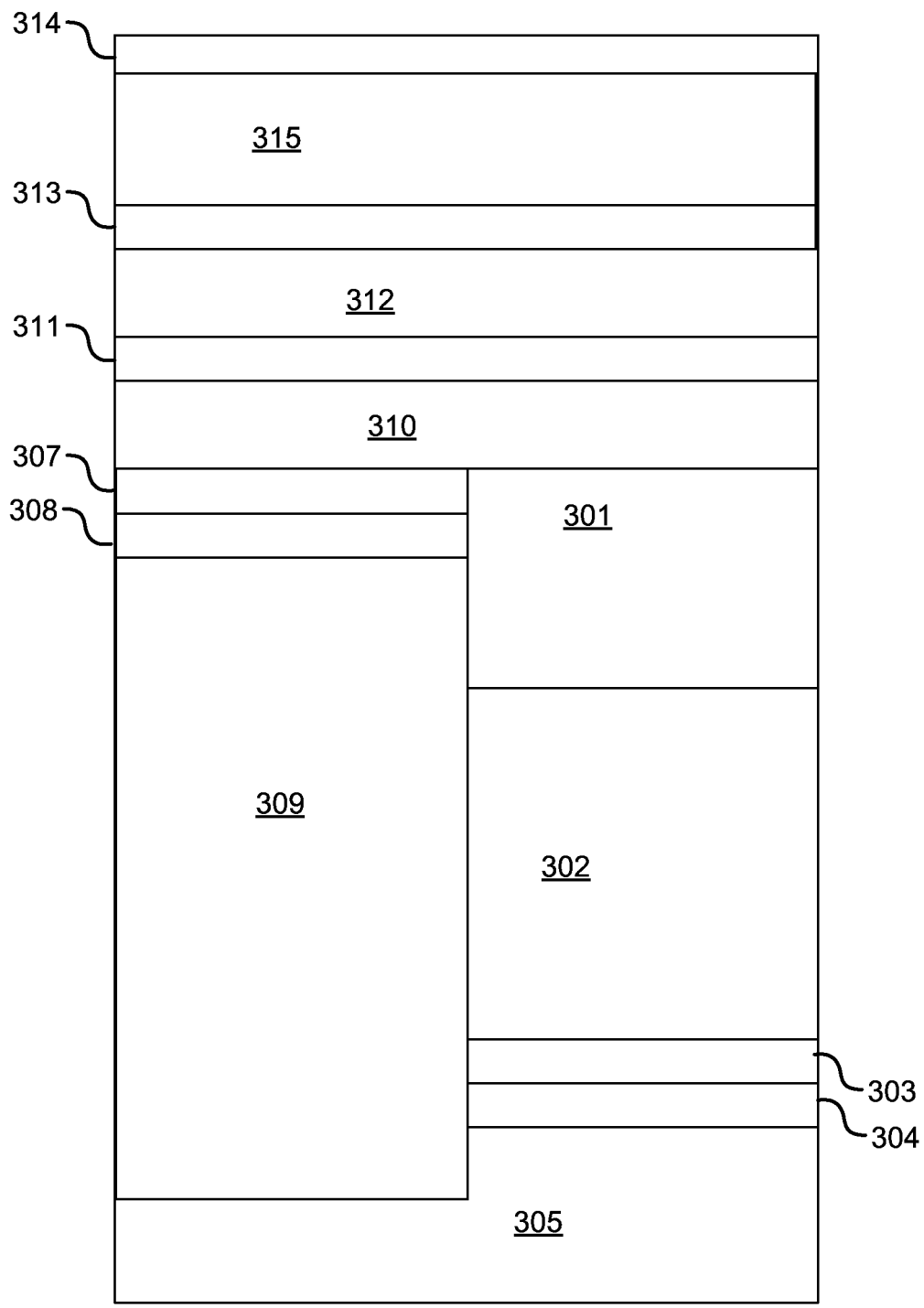

FIG. 3D illustrates a fourth process step of the second method of making a TMR read head. The fourth process step proceeds similarly to the fourth process step of the first method. Like the fourth process step of the first method, this process can be performed in situ or ex situ with the third process step. An etch cleaning step removes a certain thickness of material from the uppermost layers—for example, 50 nm. Next, a pinned layer comprising a first ferromagnetic layer 310 and a second ferromagnetic layer 312 sandwiching a non-magnetic layer 311 is deposited on the substrate assembly after cleaning. Afterwards, a seed layer 313, free layer 315 and capping layer 314 are deposited on the pinned layer. In some cases, the assembly is then magnetically annealed.

As in the first method, after the capping layer 314 is deposited, the assembly may be magnetically annealed. Additionally, the manufacture of the assembly up to FIG. 3C may be performed in situ or ex situ with the completion of the assembly in FIG. 3D.

Figure 3E:
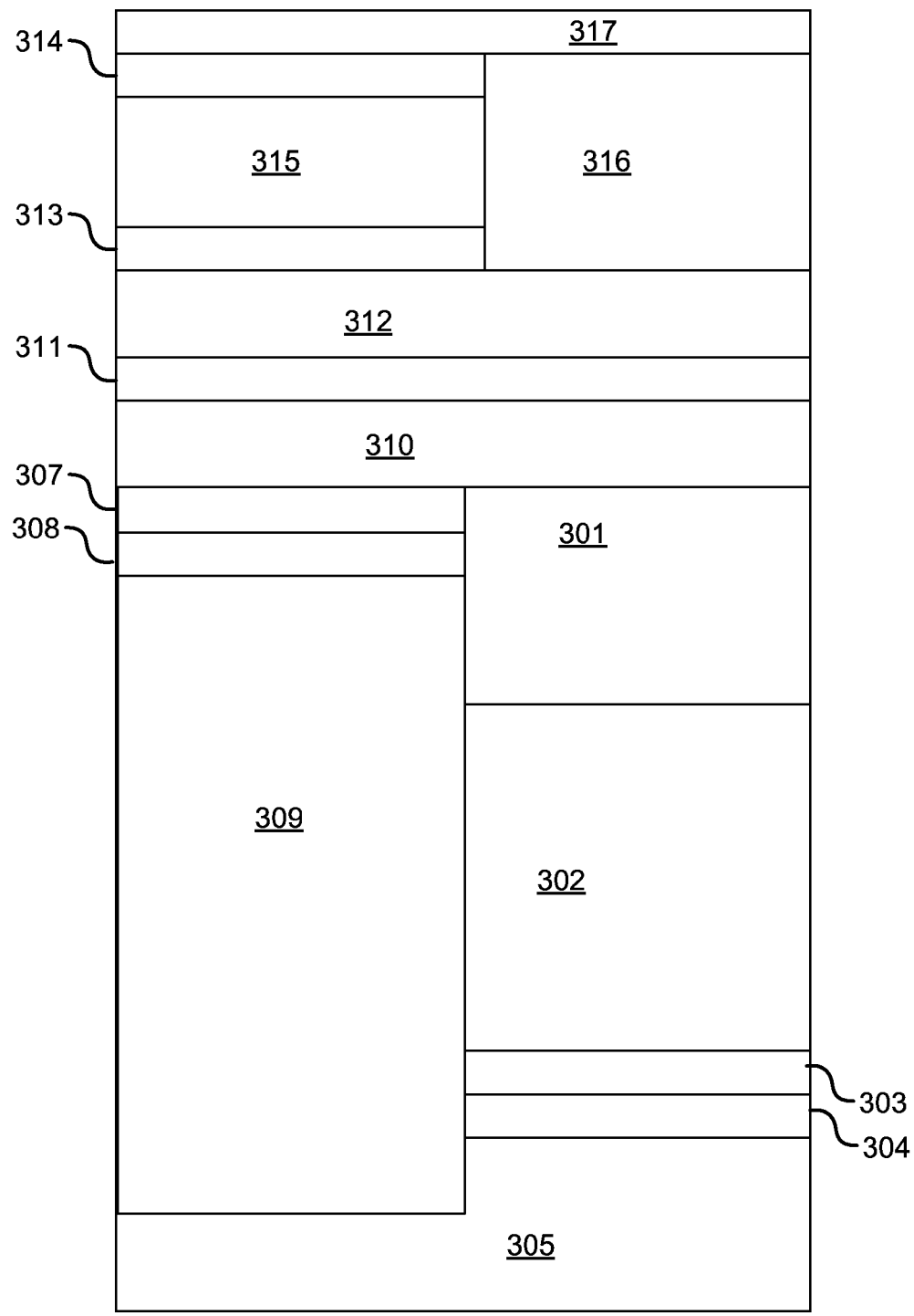

FIG. 3E illustrates a fifth process step of the second method of making a TMR read head. This process proceeds in a substantially similar manner as described above with respect to FIG. 2E. After the track height and stripe width of the free layer 315 are defined, a filling material 316 is deposited to form a planar region with the capping layer 314 and a top shield layer 317 are deposited on layers 314 and 316.

In the foregoing specification, embodiments of the invention have been described with reference to specific exemplary features thereof. It will, however, be evident that various modifications and changes may be made thereto without departing from the broader spirit and scope of the invention as set forth in the appended claims. The specification and figures are, accordingly, to be regarded in an illustrative rather than a restrictive sense.

What is claimed is:

1. A method, comprising:
    obtaining a substrate comprising a shield layer;
    depositing a read sensor seed layer on the substrate over the shield layer;
    forming a photoresist pattern on the read sensor seed layer;
    etching the read sensor seed layer and shield layer to form a region for antiferromagnetic layer and antiferromagnet exchange biased pinned layer deposition, the region being recessed from an air bearing surface plane;
    depositing the antiferromagnetic layer in the region; and
    depositing the antiferromagnet exchange biased pinned layer in the region over the antiferromagnetic layer.

2. The method of claim 1, further comprising:
    etching the substrate for surface planarization after depositing the antiferromagnet exchange biased pinned layer in the region;
    depositing a second pinned layer over the antiferromagnet exchange biased pinned layer and the remaining read sensor seed layer intersecting the air bearing surface plane;
    depositing a barrier layer over the second pinned layer and intersecting the air bearing surface plane;
    depositing a free layer over the barrier layer and intersecting the air bearing surface plane; and
    depositing a capping layer over the free layer and intersecting the air bearing surface plane.

3. The method of claim 2, further comprising magnetically annealing an assembly formed after the step of depositing the capping layer.

4. The method of claim 1, wherein the steps of etching the read sensor seed layer and shield layer to form a region for the antiferromagnet exchange biased pinned layer deposition and depositing the antiferromagnet exchange biased pinned layer are performed in situ.

5. The method of claim 1, wherein the steps of etching the read sensor seed layer and shield layer to form a region for the antiferromagnet exchange biased pinned layer deposition and depositing the antiferromagnet biased pinned layer are performed ex situ.

6. The method of claim 1, wherein the step of depositing the antiferromagnet exchange biased pinned layer comprises:
    depositing a first soft ferromagnetic layer over the antiferromagnetic layer;
    depositing a non-magnetic layer over the first soft ferromagnetic layer; and
    depositing a second soft ferromagnetic layer over the non-magnetic layer; and
    the non-magnetic layer having a thickness approximately equal to a first or a second oscillatory peak of the exchange coupling between the first soft ferromagnetic layer and the second soft ferromagnetic layer; and
    the non-magnetic layer comprising Ru, Cr, Ag, or Au.

* * * * *